US008895346B2

(12) United States Patent
Takizawa

(10) Patent No.: US 8,895,346 B2
(45) Date of Patent: Nov. 25, 2014

(54) SOLID-STATE IMAGING DEVICE, MANUFACTURING METHOD FOR THE SAME, AND IMAGING APPARATUS

(75) Inventor: Masaaki Takizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 330 days.

(21) Appl. No.: 13/542,183

(22) Filed: Jul. 5, 2012

(65) Prior Publication Data
US 2012/0276680 A1 Nov. 1, 2012

Related U.S. Application Data

(62) Division of application No. 12/379,336, filed on Feb. 19, 2009, now Pat. No. 8,242,548.

(30) Foreign Application Priority Data

Mar. 11, 2008 (JP) ................................. 2008-060630

(51) Int. Cl.
H01L 21/00 (2006.01)
H01L 27/146 (2006.01)
H01L 27/148 (2006.01)

(52) U.S. Cl.
CPC .... H01L 27/14683 (2013.01); H01L 27/14623 (2013.01); H01L 27/14818 (2013.01)
USPC ........ 438/69; 257/294; 257/E31.122; 438/57; 438/65

(58) Field of Classification Search
USPC ..................... 257/59, 72, 292, 294, 435, 444, 257/E31.121, E31.122, E25.032; 438/57, 438/65, 69, 70, 72
See application file for complete search history.

(56) References Cited

U.S. PATENT DOCUMENTS

| 5,583,675 A | 12/1996 | Yamada et al. |
| 6,528,824 B2 | 3/2003 | Yamagata et al. |
| 7,205,623 B2 | 4/2007 | Hong et al. |
| 7,919,798 B2 | 4/2011 | Lee |
| 2008/0105908 A1 | 5/2008 | Lee |

FOREIGN PATENT DOCUMENTS

| JP | 01-191481 | 8/1989 |
| JP | 04-337667 | 11/1992 |
| JP | 07-086545 | 3/1995 |
| JP | 07-094694 A | 4/1995 |
| JP | 2001-015725 A | 1/2001 |
| JP | 2002-246579 A | 8/2002 |
| JP | 2007-081139 A | 3/2007 |
| JP | 2007-081142 A | 3/2007 |
| JP | 2009-170469 A | 7/2009 |

OTHER PUBLICATIONS

Japanese Office Action issued Oct. 16, 2012 for corresponding Japanese Application No. 2008-060630.

Primary Examiner — David Vu
(74) Attorney, Agent, or Firm — Rader, Fishman & Grauer PLLC

(57) ABSTRACT

A solid-state imaging device includes: a pixel section including, in a semiconductor substrate, plural photoelectric conversion sections that photoelectrically convert incident light to generate signal charges; metal wirings formed, on a first insulating film formed on the semiconductor substrate, above regions among the photoelectric conversion sections and above the periphery of the pixel section; a second insulating film formed on the first insulating film to cover the metal wirings; a first light shielding film formed on the second insulating film and having an opening above the pixel section; and a second light shielding film formed above the metal wirings above the pixel section and having thickness smaller than that of the first light shielding film.

9 Claims, 10 Drawing Sheets

SOLID-STATE IMAGING DEVICE, MANUFACTURING METHOD FOR THE SAME, AND IMAGING APPARATUS

CROSS-REFERENCES TO RELATED APPLICATIONS

The present invention is a Divisional application of U.S. patent application Ser. No. 12/379,336, filed Feb. 19, 2009, and contains subject matter related to Japanese Patent Application JP 2008-060630 filed in the Japanese Patent Office on Mar. 11, 2008, the entire contents of which being incorporated herein by reference.

BACKGROUND OF THE INVENTION

1. Field of the Invention

The present invention relates to a solid-state imaging device, a manufacturing method for the same, and an imaging apparatus.

2. Description of the Related Art

A solid-state imaging device in the past includes a photoelectric conversion region formed in a semiconductor substrate, signal reading out means for reading out signal charges generated in the photoelectric conversion region, and a metal light shielding film that is formed on the semiconductor substrate via an insulating film and has an opening on the photoelectric conversion region. The metal light shielding film is formed of, for example, aluminum.

When oblique incident light is made incident on the photoelectric conversion region of the solid-state imaging device having such structure, the incident light is reflected on an end face and a surface of the light shielding film and made incident on an element different from a photoelectric conversion section that should originally receive the light. This incident light is photoelectrically converted into a false signal charge in a photoelectric conversion section different from the photoelectric conversion section on which the light should originally be made incident.

In order to solve the problem, in some solid-state imaging devices, a black dyed layer (see, for example, JP-A-4-337667), black insulative resin (see, for example, JP-A-1-191481), and a black color resist in which pigment, carbon black, or the like is included (see, for example, JP-A-7-86545) are used as light shielding films instead of the metal light shielding film.

When the periphery of the photoelectric conversion sections is shielded from light by using the black insulative resin or the like, the thickness equal to or larger than 1 is necessary to suppress flare light due to metal wirings in a large area.

For example, when a light shielding film made of one layer of the black insulative resin is formed not only in the periphery of a pixel region having plural photoelectric conversion sections but also among the photoelectric conversion sections, a light shielding film as high as about 1 μm is formed among the photoelectric conversion sections as in the periphery of the pixel region.

Therefore, a part of oblique incident light about to be made incident on the photoelectric conversion sections is blocked by the light shielding film formed among the photoelectric conversion sections. This is a cause of a fall in the sensitivity of the solid-state imaging device.

SUMMARY OF THE INVENTION

The present invention addresses a problem in that, when a light shielding film around an opening formed above a pixel and a light shielding film formed above regions among photoelectric conversion sections in the pixel are formed in the same thickness in order to suppress flare light, a part of oblique incident light on the photoelectric conversion sections is blocked and sensitivity falls.

Therefore, it is desirable to simultaneously realize both the suppression of the flare light and the prevention of the fall in sensitivity.

According to an embodiment of the present invention, there is provided a solid-state imaging device including:

a pixel section including, in a semiconductor substrate, plural photoelectric conversion sections that photoelectrically convert incident light to generate signal charges;

metal wirings formed, on a first insulating film formed on the semiconductor substrate, above regions among the photoelectric conversion sections and above the periphery of the pixel section;

a second insulating film formed on the first insulating film to cover the metal wirings;

a first light shielding film formed on the second insulating film and having an opening above the pixel section; and a second light shielding film formed above the metal wirings above the pixel section and having thickness smaller than that of the first light shielding film.

In the solid-state imaging device according to the embodiment, the first light shielding film can be formed in the thickness equal to or larger than 1 win order to suppress flare light due to the metal wirings in a large area. Even if the first light shielding film is formed in such thickness, the second light shielding film formed above the metal wirings above the pixel section is formed in the thickness smaller than that of the first light shielding film. Therefore, a part of oblique incident light about to be made incident on the photoelectric conversion sections, which is blocked by the light shielding film having the thickness in the past, i.e., the light shielding film having the thickness equal to the thickness of the first light shielding film, can be made incident on the photoelectric conversion sections.

Further, since the second light shielding film is formed above regions among the photoelectric conversion sections in the opening, flare light is suppressed.

According to another embodiment of the present invention, there is provided a manufacturing method (a first manufacturing method) for a solid-state imaging device including the steps of:

forming, on a first insulating film that covers a pixel section having plural photoelectric conversion sections that are formed in a semiconductor substrate and photoelectrically convert incident light to generate signal charges, metal wirings above regions among the photoelectric conversion sections and above the periphery of the pixel section;

forming a first light shielding film via a second insulating film that covers the metal wirings;

forming an opening in the first light shielding film above the pixel section;

forming a second light shielding film that has thickness smaller than that of the first light shielding film on the first light shielding film including the opening; and removing, while leaving the second light shielding film on the second insulating film above the metal wirings above the pixel section, the second light shielding film formed in other regions.

In the manufacturing method (the first manufacturing method) for a solid-state imaging device according to the embodiment, the first light shielding film can be formed in the thickness equal to or larger than 1 win order to suppress flare light due to the metal wirings in a large area. Even if the first light shielding film is formed in such thickness, the second light shielding film formed above the metal wirings above the pixel section is formed in the thickness smaller than that of the first light shielding film. Therefore, a part of oblique incident light about to be made incident on the photoelectric conversion sections, which is blocked by the light shielding film having the thickness in the past, i.e., the light shielding film having the thickness equal to the thickness of the first light shielding film, can be made incident on the photoelectric conversion sections.

Further, since the second light shielding film is formed above regions among the photoelectric conversion sections in the opening, flare light is suppressed.

According to still another embodiment of the present invention, there is provided a manufacturing method (a second manufacturing method) for a solid-state imaging device including the steps of:

forming, on a first insulating film that covers a pixel section having plural photoelectric conversion sections that are formed in a semiconductor substrate and photoelectrically convert incident light to generate signal charges, metal wirings above regions among the photoelectric conversion sections and above the periphery of the pixel section;

forming a second light shielding film via a second insulating film that covers the metal wirings;

removing, while leaving the second light shielding film on the second insulating film above the metal wirings above the pixel section, the second light shielding film formed in other regions;

forming, on the second insulating film, a first light shielding film that covers the second light shielding film and has thickness larger than that of the second light shielding film; and forming an opening in the first light shielding film above the pixel section.

In the manufacturing method (the second manufacturing method) for a solid-state imaging device according to the embodiment, the first light shielding film can be formed in the thickness equal to or larger than 1 µm in order to suppress flare light due to the metal wirings in a large area. Even if the first light shielding film is formed in such thickness, the second light shielding film formed above the metal wirings above the pixel section is formed in the thickness smaller than that of the first light shielding film. Therefore, a part of oblique incident light about to be made incident on the photoelectric conversion sections, which is blocked by the light shielding film having the thickness in the past, i.e., the light shielding film having the thickness equal to the thickness of the first light shielding film, can be made incident on the photoelectric conversion sections.

Further, since the second light shielding film is formed above regions among the photoelectric conversion sections in the opening, flare light is suppressed.

According to still another embodiment of the present invention, there is provided a manufacturing method (a third manufacturing method) for a solid-state imaging device including the steps of:

forming, on a first insulating film that covers a pixel section having plural photoelectric conversion sections that are formed in a semiconductor substrate and photoelectrically convert incident light to generate signal charges, metal wirings above regions among the photoelectric conversion sections and above the periphery of the pixel section;

forming a second light shielding film via a second insulating film that covers the metal wirings;

removing, while leaving the second light shielding film above the metal wirings above the pixel section, the remaining second light shielding film above the pixel section to form an opening;

forming, on the second insulating film, a first light shielding film that covers the second light shielding film; and forming an opening in the first light shielding film above the pixel section.

In the manufacturing method (the third manufacturing method) for a solid-state imaging device according to the embodiment, a light shielding film formed by combining the first light shielding film and the second light shielding film can be formed in the thickness equal to or larger than 1 µm in order to suppress flare light due to the metal wirings in a large area. Even if the light shielding film is formed in such thickness, the second light shielding film formed above the metal wirings above the pixel section is formed in the thickness smaller than that of the light shielding film. Therefore, a part of oblique incident light about to be made incident on the photoelectric conversion sections, which is blocked by the light shielding film having the thickness in the past, i.e., the light shielding film having the thickness equal to the thickness of the first light shielding film, can be made incident on the photoelectric conversion sections.

Further, since the second light shielding film is formed above regions among the photoelectric conversion sections in the opening, flare light is suppressed.

According to still another embodiment of the present invention, there is provided an imaging apparatus including:

a condensing optical unit that condenses incident light;

a solid-state imaging device that receives the light condensed by the condensing optical unit and photoelectrically converts the light; and a signal processing unit that processes the photoelectrically-converted signal, wherein the solid-state imaging device includes:

a pixel section including, in a semiconductor substrate, plural photoelectric conversion sections that photoelectrically convert incident light to generate signal charges;

metal wirings formed, on a first insulating film formed on the semiconductor substrate, above regions among the photoelectric conversion sections and above the periphery of the pixel section;

a second insulating film formed on the first insulating film to cover the metal wirings;

a first light shielding film formed on the second insulating film and having an opening above the pixel section; and a second light shielding film formed above the metal wirings above the pixel section and having thickness smaller than that of the first light shielding film.

In the imaging apparatus according to the embodiment, since the solid-state imaging device according to the embodiment explained above is used, a part of oblique incident light about to be made incident on the photoelectric conversion sections, which is blocked by the light shielding film in the past, can be made incident on the photoelectric conversion sections.

Further, since the second light shielding film is formed above regions among the photoelectric conversion sections in the opening, flare light is suppressed.

Since the solid-state imaging device according to the embodiment includes the first light shielding film that has the opening above the pixel section and the second light shielding film that is formed above the metal wirings above the pixel section and has thickness smaller than that of the first light shielding film, it is possible to simultaneously realize both the suppression of flare light and the prevention of a fall in sensitivity. Therefore, there is an advantage that it is possible to realize improvement of an image quality of the solid-state imaging device.

In the first manufacturing method for a solid state imaging device according to the embodiment, since the first light shielding film that has the opening above the pixel section is formed and the second light shielding film that has thickness smaller than that of the first light shielding film is formed above the metal wirings above the pixel section, it is possible to simultaneously realize both the suppression of flare light and the prevention of a fall in sensitivity. Therefore, there is an advantage that it is possible to realize improvement of an image quality of the solid-state imaging device.

In the second manufacturing method for a solid state imaging device according to the embodiment, since the first light shielding film that has the opening above the pixel section is formed and the second light shielding film that has thickness smaller than that of the first light shielding film is formed above the metal wirings above the pixel section, it is possible to simultaneously realize both the suppression of flare light and the prevention of a fall in sensitivity. Therefore, there is an advantage that it is possible to realize improvement of an image quality of the solid-state imaging device.

In the third manufacturing method for a solid state imaging device according to the embodiment, since the first light shielding film and the second light shielding film that have the openings above the pixel section are formed and the second light shielding film is left above the metal wirings above the pixel section, it is possible to simultaneously realize both the suppression of flare light and the prevention of a fall in sensitivity. Therefore, there is an advantage that it is possible to realize improvement of an image quality of the solid-state imaging device.

In the imaging apparatus according to the embodiment, since the solid-state imaging device according to the embodiment explained above is used, it is possible to simultaneously realize both the suppression of flare light and the prevention of a fall in sensitivity. Therefore, there is an advantage that it is possible to realize improvement of an image quality of the solid-state imaging device.

DESCRIPTION OF THE PREFERRED EMBODIMENTS

A solid-state imaging device according to an embodiment (a first embodiment) of the present invention is explained with reference to a schematic sectional view in FIG. 1.

Figure 1:
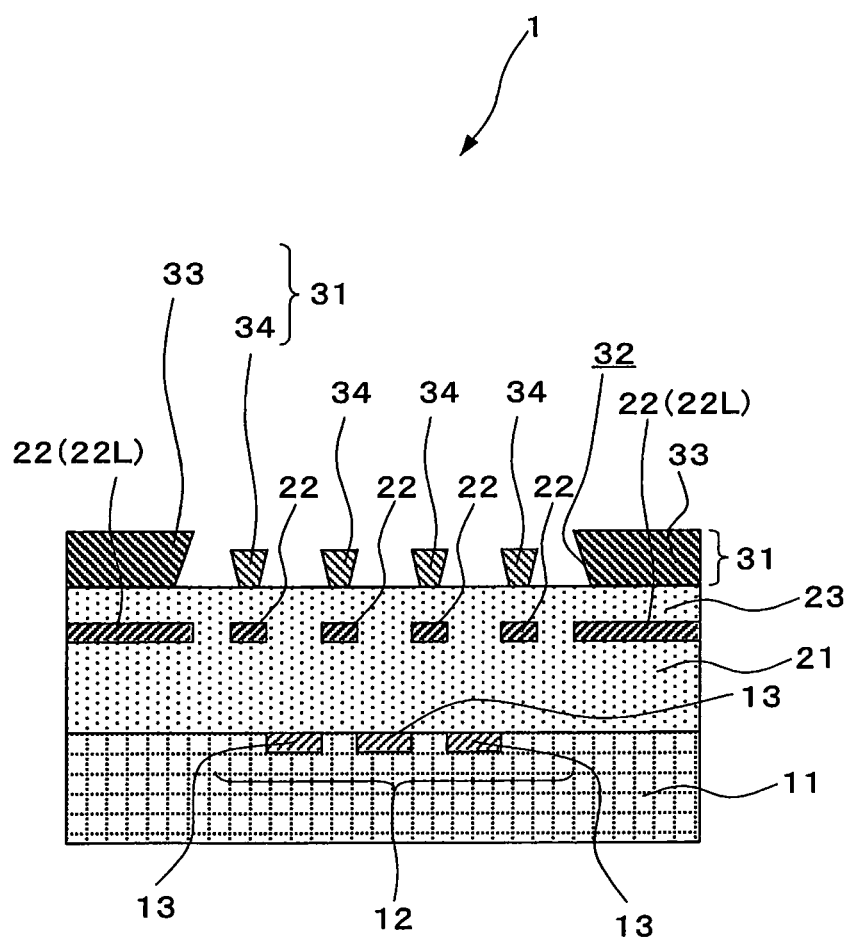
FIG. 1 is a schematic sectional view of a solid-state imaging device according to an embodiment (a first embodiment) of the present invention.

As shown in FIG. 1, a pixel section 12 is formed in a semiconductor substrate 11. In the pixel section 12, plural photoelectric conversion sections 13 that photoelectrically convert incident light are formed. Although not shown in the figure, in the semiconductor substrate 11, a readout section for reading out signal charges from the photoelectric conversion sections 13 and a charge transfer section for transferring the signal charges read out by the readout section are formed on one side of the photoelectric conversion sections 13. A channel stop region for pixel separation is formed on the other side of the photoelectric conversion sections 13.

An integrated circuit (not shown) for driving the solid-state imaging device is formed around the photoelectric conversion sections 13. Large-pattern metal wirings 22 (22L) are arranged above the integrated circuit, which causes malfunction because of incident of light, to prevent the malfunction.

A first insulating film 21 that covers a transfer electrode (not shown) formed in the charge transfer section is formed on the semiconductor substrate 11. The metal wirings 22 are formed on the first insulating film 21. A second insulating film 23 that covers the metal wirings 22 is formed on the first insulating film 21. The second insulating film 23 is formed of a silicon nitride film, a silicon oxide nitride film, of a silicon oxide film. More preferably, the silicon nitride film is used. Moisture from a light shielding film 31 formed on the second insulating film 23 can be prevented from penetrating the photoelectric conversion sections 13 by forming the second insulating film 23 with an inorganic insulating film such as the silicon nitride film. The light shielding film 31 that covers the metal wirings 22 is formed on the second insulating film 23.

The light shielding film 31 includes a first light shielding film 33 that is formed on the second insulating film 23 and has an opening 32 above the pixel section 12. Further, the light shielding film 31 includes a second light shielding film 34 that is formed above the metal wirings 22 above the pixel section 12 in the opening 32 and has thickness smaller than that of the first light shielding film 33.

The opening 32 means a space, a side periphery of which is surrounded by a sidewall of the first light shielding film 33 on the pixel section 12.

The first light shielding film 33 and the second light shielding film 34 are formed of insulative resin having light shielding properties. The insulative resin having light shielding properties is formed of black or blackish photosensitive insulative resin. Consequently, reflection of the light shielding films is suppressed. Moreover, it is unnecessary to form a resist mask for the patterning. In other words, there is an advantage that the patterning can be directly performed by exposure and development.

As an example of the insulative resin having light shielding properties and the black photosensitive insulative resin, there is a black color resist.

As a dye containing the black color resist as a black color, for example, there is a dye obtained by mixing plural pigments of blue and red. There is also a black pigment having low transmittance in a wide wavelength (e.g., a wavelength of visible light) band.

A dye with a mixing ratio of a resist and a pigment adjusted such that average transmittance is, for example, equal to or higher than 5% and equal to or lower than 40% with respect to, for example, light in a range of wavelength from 400 nm to 700 nm or in a wavelength band of visible light is used. If this average transmittance is lower than 5%, since photosensitivity of a photoresist is not sufficiently obtained, the patterning is difficult. If the average transmittance exceeds 40%, since light shielding properties are insufficient, a problem occurs in functions of the light shielding films. Therefore, the average transmittance is set to be equal to or higher than 5% and equal to or lower than 40%.

A negative resist is used as the resist. As an example, an acrylic negative resist or a polyimide negative resist is used.

In the light shielding film of the solid-state imaging device 1, the first light shielding film 33 formed of the black insulative resin patterned by the lithography method attenuates light reflected on the metal wirings 22 in a large area present in regions other than above a region where the plural photoelectric conversion sections are formed.

For the first light shielding film 33, it is necessary to select thickness for suppressing an amount of light reflected on the metal wirings 22 in the large area to be equal to or smaller than a fixed amount. For example, thickness equal to or larger than 1.0 μm is necessary.

Figure 2:
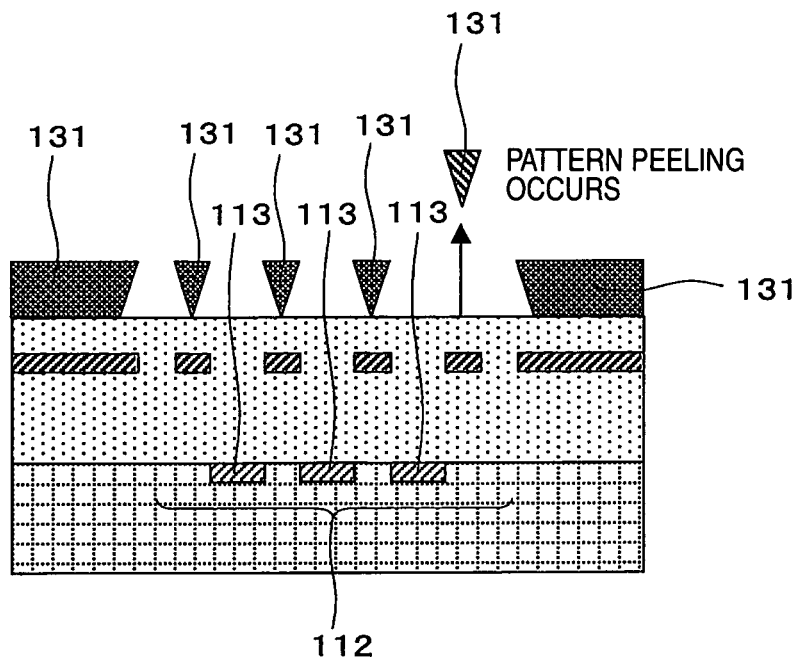
FIG. 2 is a schematic sectional view of a problem of peeling of a light shielding film in the past.

The black color resist is usually a negative resist and has a high attenuation ratio with respect to exposure light used for the patterning. Therefore, as shown in FIG. 2, when a light shielding film 131 is formed of a black color resist having the thickness of about 1.0 μm above regions among photoelectric conversion sections 113 (equivalent to the photoelectric conversion sections 13 according to this embodiment) of a pixel section 112, a sectional shape of the light shielding film 131 is an undercut shape. When a pattern of the light shielding film 131 is fine, a grounding area of the pattern is small. Therefore, pattern peeling occurs.

The refining of the pattern of the light shielding film 131 formed above regions among the photoelectric conversion sections 113 is in a conflicting relation with the thickness of the light shielding film 131 and a flare prevention effect. For example, a relation between the minimum line width and the thickness of the light shielding film 131 is shown in FIG. 3.

Figure 3:
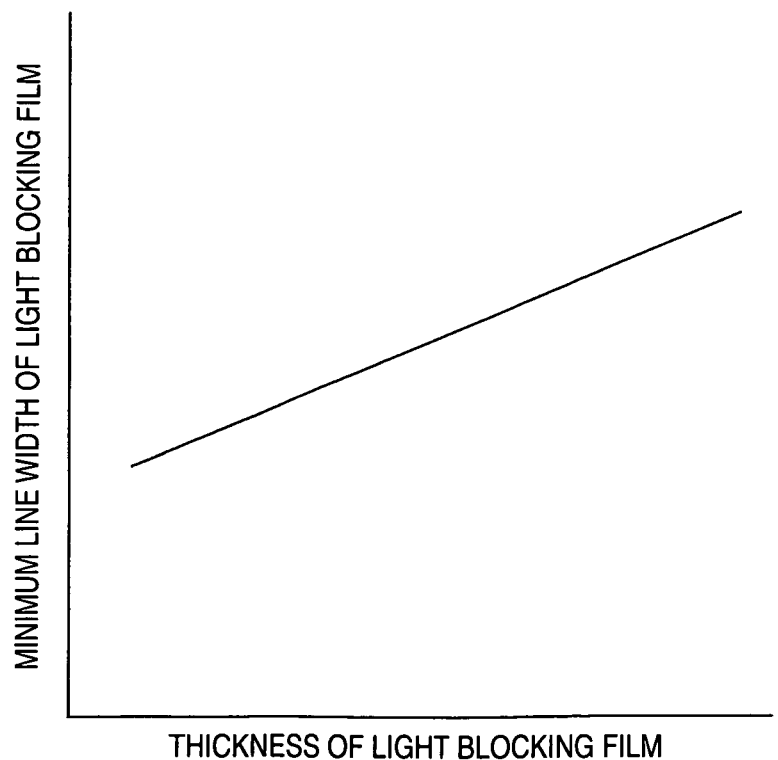
FIG. 3 is a graph of a relation between the minimum line width and the thickness of a light shielding film.

As shown in FIG. 3, the minimum line width and the thickness of the light shielding film 131 are in a proportional relation. Therefore, as the thickness of the light shielding film 131 increases, the minimum line width that can be formed by the light shielding film 131 also increases. The flare prevention effect is improved as the thickness of the light shielding film 131 increases.

Therefore, as indicated by FIG. 1, in narrow regions like the regions among the photoelectric conversion sections 13, the line width of the second light shielding film 34 formed above the metal wirings 22 above the pixel section 12 is formed small. Therefore, since it is difficult to form the light shielding film 34 as thick as, for example, 1.0 μm like the first light shielding film 33, it is necessary to form the second light shielding film 34 in thickness smaller than that of the first light shielding film 33 and, accordingly, an attenuation ratio of flare light decreases.

However, concerning the decrease in the attenuation ratio of flare light, since an area of metal wirings is small, it is possible to suppress an amount of the flare light to be equal to or smaller than a fixed amount.

Therefore, in this embodiment, the second light shielding film 34 above the metal wirings 22 above the pixel section 12 is formed in thickness smaller than that of the first light shielding film 33 to make it possible to secure adhesion with a substrate even if undercut occurs in a sectional shape and the second light shielding film 34 is formed in a so-called reverse taper shape. For example, the thickness of the first light shielding film 33 is set to 1.0 μm and the thickness of the second light shielding film 34 is set to 0.5 μm. In this way, the thickness of the second light shielding film 34 is set smaller than that of the first light shielding film 33. Consequently, an area of grounding with the substrate is twice as large as that of the second light shielding film 34 formed in thickness equal to that of the first light shielding film 33 as in the past. As a result, since peeling of the second light shielding film 34 is prevented, it is possible to improve the flare prevention effect in the entire solid-stage imaging device 1.

It is also possible to improve the flare prevention effect by increasing the width of the second light shielding film 34 such that a pattern can be formed in single thickness. However, since a part of oblique incident light is blocked, a fall in sensitivity due to a reduction in an opening area of the photoelectric conversion sections 13 poses a problem. Since the second light shielding film 34 provided above the metal wirings 22 above the pixel section 12 is formed in thickness smaller than that of the first light shielding film 33 provided around the pixel region, at least a part of the oblique incident light penetrates the photoelectric conversion sections 13. Consequently, since an amount of incident light on the photoelectric conversion sections 13 increases, improvement of the sensitivity of the solid-state imaging device can be realized.

In short, in the solid-state imaging device 1, the first light shielding film 33 can be formed in the thickness equal to or larger than 1 μm in order to suppress the flare light due to the metal wirings in the large area. Even if the first light shielding film 33 is formed in such thickness, the second light shielding film 34 formed above the metal wirings 22 above the pixel section 12 in the opening 32 is formed in thickness smaller than that of the first light shielding film 33. Therefore, a part of the oblique incident light about to be made incident on the photoelectric conversion sections 13, which is blocked by the light shielding film having the thickness in the past, i.e., the light shielding film having film thickness equal to the thickness of the first light shielding film 33, can be made incident on the photoelectric conversion sections 13.

Since the second light shielding film 34 is formed above in the regions above the photoelectric conversion sections 33 in the opening 32, flare light is suppressed.

In this way, with the solid-state imaging device 1 according to this embodiment, it is possible to solve the problem of peeling of the light shielding film 31 (the second light shielding film 34) and reduce flare light.

Therefore, there is an advantage that it is possible to obtain a solid-state imaging device excellent in an image quality with flare light reduced.

A solid-state imaging device according to an embodiment (a second embodiment) of the present invention is explained with reference to a schematic sectional view in FIG. 4. A solid-state imaging device 2 according to the second embodiment is a solid-state imaging device mounted with a color filter in addition to the components of the solid-state imaging device 1.

Figure 4:
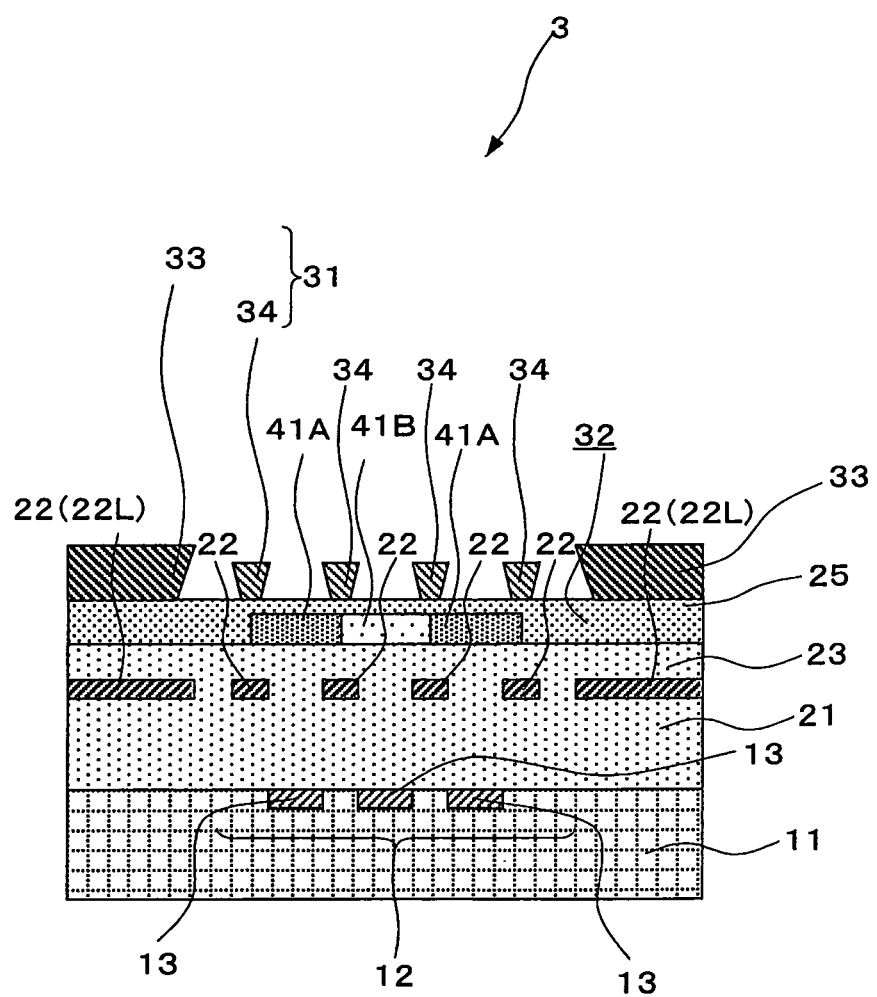
FIG. 4 is a schematic sectional view of a solid-state imaging device according to an embodiment (a second embodiment) of the present invention.

As shown in FIG. 4, the pixel section 12 is formed in the semiconductor substrate 11. In the pixel section 12, the plural photoelectric conversion sections 13 that photoelectrically convert incident light are formed. Although not shown in the figure, in the semiconductor substrate 11, a readout section for reading out signal charges from the photoelectric conversion sections 13 and a charge transfer section for transferring the signal charges read out by the readout section are formed on one side of the photoelectric conversion sections 13. A channel stop region for pixel separation is formed on the other side of the photoelectric conversion sections 13.

An integrated circuit (not shown) for driving the solid-state imaging device is formed around the photoelectric conversion sections 13. The large-pattern metal wirings 22 (22L) are arranged above the integrated circuit, which causes malfunction because of incident of light, to prevent the malfunction.

The first insulating film 21 that covers a transfer electrode (not shown) formed in the charge transfer section is formed on the semiconductor substrate 11. The metal wirings 22 are formed on the first insulating film 21. The second insulating film 23 that covers the metal wirings 22 is formed on the first insulating film 21. The second insulating film 23 is formed of a silicon nitride film, a silicon oxide nitride film, of a silicon oxide film. More preferably, the silicon nitride film is used. Moisture from a color filter layer 41 and the light shielding film 31 formed on the second insulating film 23 can be prevented from penetrating the photoelectric conversion sections 13 by forming the second insulating film 23 with an inorganic insulating film such as the silicon nitride film.

A desired color filter layer 41 is formed on the second insulating film 23 in association with positions above the photoelectric conversion sections 13. The color filter layer 41 is formed by, for example, color filter layers 41A and 41B of predetermined colors in association with the photoelectric conversion sections 13, respectively. For example, the color filter layer 41 may be formed by a color filter layer for red, a color filter layer for green, and a color filter layer for blue. It goes without saying that color filter layers for complementary colors may be used and color filer layers for colors other than the colors described above may be used. A third insulating film 25 is formed on the color filter layer 41.

Color resists are left in order to planarize regions other than a region above the pixel section 12. Actually, since unevenness occurs among different color resists, the third insulating film 25 made of transparent resin is formed in order to planarize steps among the color resists.

The light shielding film 31 that covers the metal wirings 22 is formed on the third insulating film 25.

The light shielding film 31 includes the first light shielding film 33 that is formed on the second insulating film 23 and in which the opening 32 is formed above the pixel section 12. Further, the light shielding film 31 includes the second light shielding film 34 that is formed above the metal wirings 22 above the pixel section 12 in the opening 32 and has thickness smaller than that of the first light shielding film 33.

The opening 32 means a space, a side periphery of which is surrounded by the sidewall of the first light shielding film 33 on the pixel section 12.

The first light shielding film 33 and the second light shielding film 34 are formed of insulative resin having light shielding properties. The insulative resin having light shielding properties is formed of black photosensitive insulative resin. Consequently, reflection of the light shielding films is suppressed. Moreover, it is unnecessary to form a resist mask for the patterning. In other words, there is an advantage that the patterning can be directly performed by exposure and development.

As an example of the insulative resin having light shielding properties and the black photosensitive insulative resin, there is a black color resist.

As a dye containing the black color resist as a black color, for example, there is a dye obtained by mixing plural pigments of blue and red. There is also a black pigment having low transmittance in a wide wavelength (e.g., a wavelength of visible light) band.

A dye with a mixing ratio of a resist and a pigment adjusted such that average transmittance is, for example, equal to or higher than 5% and equal to or lower than 40% with respect to, for example, light in a range of wavelength from 400 nm to 700 nm or in a wavelength band of visible light is used. If this average transmittance is lower than 5%, since photosensitivity of a photoresist is not sufficiently obtained, the patterning is difficult. If the average transmittance exceeds 40%, since light shielding properties are insufficient, a problem occurs in functions of the light shielding films. Therefore, the average transmittance is set to be equal to or higher than 5% and equal to or lower than 40%.

A negative resist is used as the resist. As an example, an acrylic negative resist or a polyimide negative resist is used.

In the solid-state imaging device 2, actions and effects same as those in the solid-state imaging device 1 are obtained.

A solid-state imaging device according to an embodiment (a third embodiment) of the present invention is explained with reference to a schematic sectional view in FIG. 5. A solid-state imaging device 3 according to the third embodiment is a solid-state imaging device mounted with a color filter in addition to the components of the solid-state imaging device 1.

Figure 5:
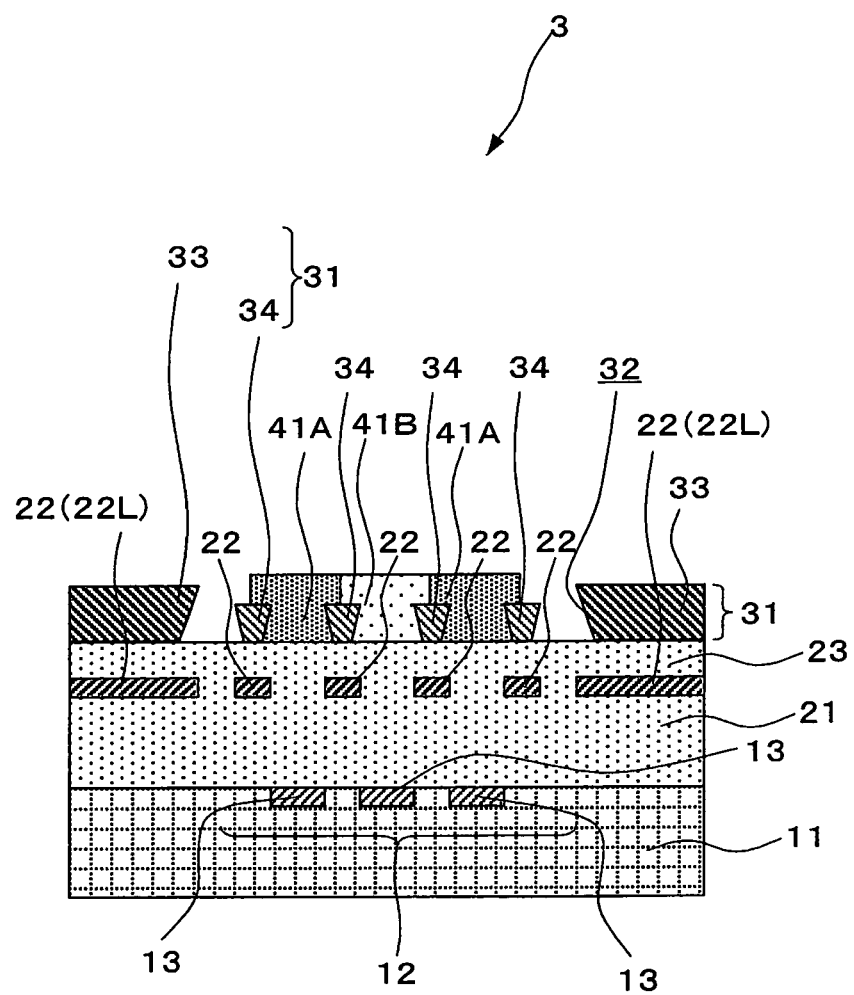
FIG. 5 is a schematic sectional view of a solid-state imaging device according to an embodiment (a third embodiment) of the present invention.

As shown in FIG. 5, the pixel section 12 is formed in the semiconductor substrate 11. In the pixel section 12, the plural photoelectric conversion sections 13 that photoelectrically convert incident light are formed in the pixel section 12. Although not shown in the figure, in the semiconductor substrate 11, a readout section for reading out signal charges from the photoelectric conversion sections 13 and a charge transfer section for transferring the signal charges read out by the readout section are formed on one side of the photoelectric conversion sections 13. A channel stop region for pixel separation is formed on the other side of the photoelectric conversion sections 13.

An integrated circuit (not shown) for driving the solid-state imaging device is formed around the photoelectric conversion sections 13. The large-pattern metal wirings 22 (22L) are arranged above the integrated circuit, which causes malfunction because of incident of light, to prevent the malfunction.

The first insulating film 21 that covers a transfer electrode (not shown) formed in the charge transfer section is formed on the semiconductor substrate 11. The metal wirings 22 are formed on the first insulating film 21. The second insulating film 23 that covers the metal wirings 22 is formed on the first insulating film 21.

The second insulating film 23 is formed of a silicon nitride film, a silicon oxide nitride film, of a silicon oxide film. More preferably, the silicon nitride film is used. Moisture from the light shielding film 31 and the color filter layer 41 formed on the second insulating film 23 can be prevented from penetrating the photoelectric conversion sections 13 by forming the second insulating film 23 with an inorganic insulating film such as the silicon nitride film.

The light shielding film 31 that covers the metal wirings 22 is formed on the second insulating film 23.

The light shielding film 31 includes the first light shielding film 33 that is formed on the second insulating film 23 and has the opening 32 above the pixel section 12. Further, the light shielding film 31 includes the second light shielding film 34 that is formed above the metal wirings 22 above the pixel section 12 in the opening 32 and has thickness smaller than that of the first light shielding film 33.

The opening 32 means a space, a side periphery of which is surrounded by the sidewall of the first light shielding film 33 on the pixel section 12.

The first light shielding film 33 and the second light shielding film 34 are formed of insulative resin having light shielding properties. The insulative resin having light shielding properties is formed of black photosensitive insulative resin. Consequently, reflection of the light shielding films is suppressed. Moreover, it is unnecessary to form a resist mask for the patterning. In other words, there is an advantage that the patterning can be directly performed by exposure and development.

As an example of the insulative resin having light shielding properties and the black photosensitive insulative resin, there is a black color resist.

As a dye containing the black color resist as a black color, for example, there is a dye obtained by mixing plural pigments of blue and red. There is also a black pigment having low transmittance in a wide wavelength (e.g., a wavelength of visible light) band.

A dye with a mixing ratio of a resist and a pigment adjusted such that average transmittance is, for example, equal to or higher than 5% and equal to or lower than 40% with respect to, for example, light in a range of wavelength from 400 nm to 700 nm or in a wavelength band of visible light is used. If this average transmittance is lower than 5%, since photosensitivity of a photoresist is not sufficiently obtained, the patterning is difficult. If the average transmittance exceeds 40%, since light shielding properties are insufficient, a problem occurs in functions of the light shielding films. Therefore, the average transmittance is set to be equal to or higher than 5% and equal to or lower than 40%.

A negative resist is used as the resist. As an example, an acrylic negative resist or a polyimide negative resist is used.

The desired color filter layer 41 is formed on the second insulating film 23 in association with positions above the photoelectric conversion sections 13. The color filter layer 41 is formed in the second light shielding film 34 in the opening 32 formed in the first light shielding film 33. The color filter layer 41 is formed by, for example, the color filter layers 41A and 41B of predetermined colors in association with the photoelectric conversion sections 13, respectively. For example, the color filter layer 41 is formed by a color filter layer for red, a color filter layer for green, and a color filter layer for blue. It goes without saying that color filter layers for complementary colors may be used and color filer layers for colors other than the colors described above may be used.

The solid-state imaging device 1 explained with reference to FIG. 2 is a solid-state imaging device for a three plate system (3CCD) image sensor or an image sensor for white and black images. The solid-state imaging devices 2 and 3 explained with reference to FIGS. 4 and 5 can be used for a color solid-state imaging device and can also be used for a single plate system color imaging device by limiting types of color filters.

In the solid-state imaging device 3, actions and effects same as those in the solid-state imaging device 1 are obtained.

A manufacturing method for the solid-state imaging device according to the first embodiment is explained with reference to sectional views of manufacturing steps in FIGS. 6A to 6D.

Figure 6A:
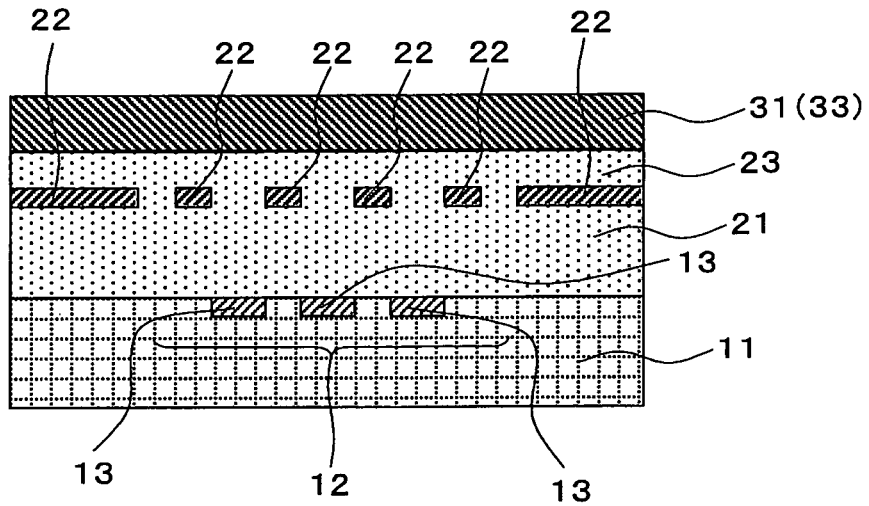
FIGS. 6A to 6D show sectional views of manufacturing steps of a manufacturing method for a solid-state imaging device according to the first embodiment.

As shown in FIG. 6A, the pixel section 12 is formed in the semiconductor substrate 11. In the pixel section 12, the plural photoelectric conversion sections 13 that photoelectrically convert incident light to generate signal charges are formed. Although not shown in the figure, in the semiconductor substrate 11, a readout section for reading out signal charges from the photoelectric conversion sections 13 and a charge transfer section for transferring the signal charges read out by the readout section are formed on one side of the photoelectric conversion sections 13. A channel stop region for pixel separation is formed on the other side of the photoelectric conversion sections 13.

The first insulating film 21 that covers a transfer electrode (not shown) formed in the charge transfer section is formed on the semiconductor substrate 11. The metal wirings 22 are formed on the first insulating film 21. The second insulating film 23 that covers the metal wirings 22 is formed on the first insulating film 21.

The second insulating film 23 is formed of a silicon nitride film, a silicon oxide nitride film, of a silicon oxide film. More preferably, the silicon nitride film is used. Moisture from the light shielding film 31 formed on the second insulating film 23 can be prevented from penetrating the photoelectric conversion sections 13 by forming the second insulating film 23 with an inorganic insulating film such as the silicon nitride film.

The light shielding film 31 is formed on the second insulating film 23. The light shielding film 31 is formed as explained below.

First, the first light shielding film 33 is formed on the second insulating film 23. The first light shielding film 33 is formed of a black photoresist in, for example, thickness equal to or larger than 1.0 μm. A material of the first light shielding film 33 is explained in detail later.

The black color resist is a negative resist. Since exposure light attenuates in the black color resist, the black color resist has an undercut sectional shape. Therefore, for example, a pattern having, for example, pattern dimension width equal to or smaller than 1.5 μm has a reduced area of grounding with a substrate and pattern peeling occurs. Therefore, it is desirable to eliminate such a pattern from a mask.

Figure 6B:
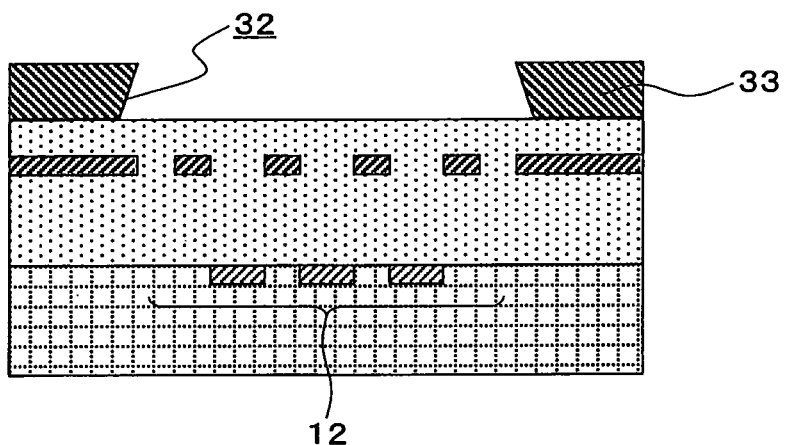

Subsequently, as shown in FIG. 6B, the first light shielding film 33 is subjected to exposure to light, development, and baking to form the opening 32 above the pixel section 12.

As an example of a lithography condition for the black color resist, a G line (436 nm) or an I line (365 nm) is used for exposure light source wavelength and exposure time is set to, for example, 1000 ms to 3000 ms. This exposure condition is only an example and appropriately changed according to a type of the black color resist.

The opening 32 means a space, a side periphery of which is surrounded by a sidewall of the first light shielding film 33 on the pixel section 12.

Figure 6C:
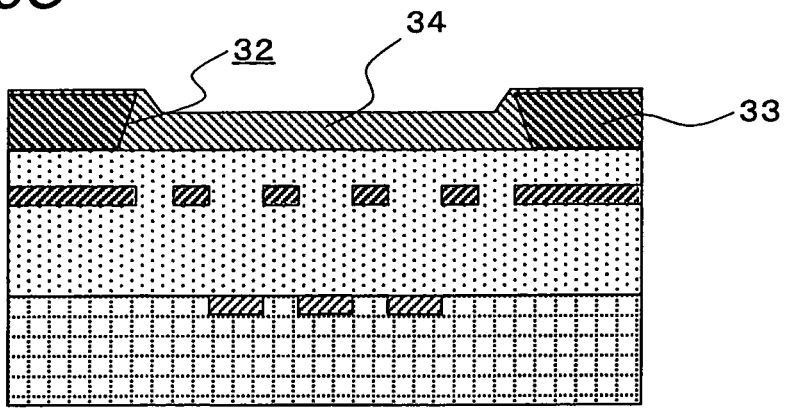

As shown in FIG. 6C, the second light shielding film 34 having thickness smaller than that of the first light shielding film 33 is formed over the entire surface in the opening 32 formed in the first light shielding film 33. The second light shielding film 34 is formed of a black photoresist in, for example, the thickness of 0.5%. A material of the second light shielding film 34 is explained in detail later.

Figure 6D:
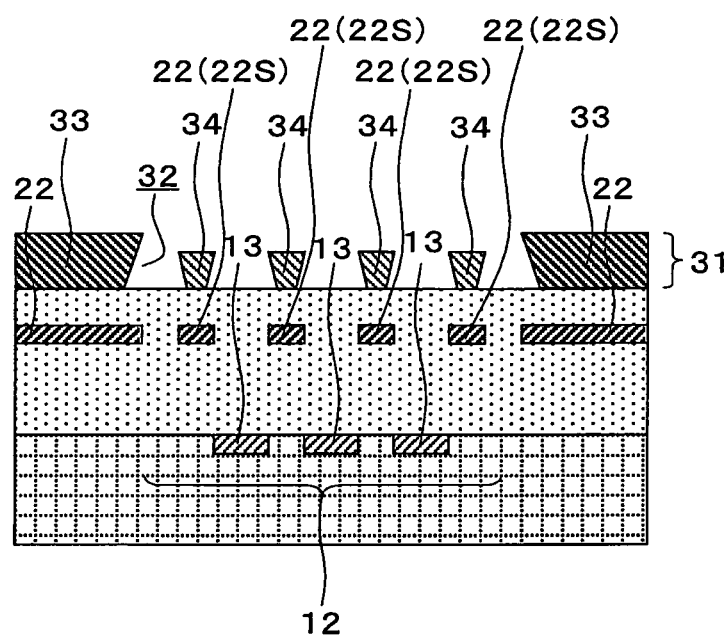

As shown in FIG. 6D, the second light shielding film 34 is subjected to exposure to light, development, and baking to leave the second light shielding film 34 above the metal wirings 22 (22S) above the pixel section 12 in the opening 32 and remove the second light shielding film 34 in the other regions. As a result, the second light shielding film 34 is formed above the metal wirings 22S above the pixel section 12 in the opening 32.

As an example of a lithography condition for the black color resist, a G line (436 nm) or an I line (365 nm) is used for exposure light source wavelength and exposure time is set to, for example, 1000 ms to 3000 ms. This exposure condition is only an example and appropriately changed according to a type of the black color resist.

When the second light shielding film 34 is patterned, since the first light shielding film 33 is cured by baking, a pattern shape is maintained even if exposure, development, and the like is applied to the second light shielding film 34.

The first light shielding film 33 and the second light shielding film 34 are formed of insulative resin having light shielding properties. The insulative resin having light shielding properties is formed of black photosensitive insulative resin. Consequently, reflection of the light shielding films is suppressed. Moreover, it is unnecessary to form a resist mask for the patterning. In other words, there is an advantage that the patterning can be directly performed by exposure and development.

As an example of the insulative resin having light shielding properties and the black photosensitive insulative resin, there is a black color resist.

As a dye containing the black color resist as a black color, for example, there is a dye obtained by mixing plural pigments of blue and red. There is also a black pigment having low transmittance in a wide wavelength (e.g., a wavelength of visible light) band.

A dye with a mixing ratio of a resist and a pigment adjusted such that average transmittance is, for example, equal to or higher than 5% and equal to or lower than 40% with respect to, for example, light in a range of wavelength from 400 nm to 700 nm or in a wavelength band of visible light is used. If this average transmittance is lower than 5%, since photosensitivity of a photoresist is not sufficiently obtained, the patterning is difficult. If the average transmittance exceeds 40%, since light shielding properties are insufficient, a problem occurs in functions of the light shielding films. Therefore, the average transmittance is set to be equal to or higher than 5% and equal to or lower than 40%.

A negative resist is used as the resist. As an example, an acrylic negative resist or a polyimide negative resist is used.

In the first manufacturing method, the first light shielding film 33 can be formed in the thickness equal to or larger than 1 μm. Therefore, since light reflected on the large-area metal wirings 22L other than regions where the photoelectric conversion sections 13 are formed is attenuated, flare light can be suppressed.

Even if the first light shielding film 33 is formed in such thickness equal to or larger than 1 μm, the second light shielding film 34 formed above the metal wirings 22 above the pixel section 12 in the opening 32 is formed in thickness smaller than that of the first light shielding film 33, for example, the thickness of 0.5 μm. Therefore, a part of the oblique incident light about to be made incident on the photoelectric conversion sections 13, which is blocked by the light shielding film having the thickness in the past, i.e., the light shielding film having film thickness equal to the thickness of the first light shielding film 33, can be made incident on the photoelectric conversion sections 13.

Consequently, since an amount of incident light on the photoelectric conversion sections 13 increases, improvement of the sensitivity of the solid-state imaging device can be realized.

Moreover, since the second light shielding film 34 is formed above the metal wirings 22 above the pixel section 12, the second light shielding film 34 has so-called submicron line width (e.g., equal to or smaller than 1.5 μm). However, the thickness of the second light shielding film 34 is smaller than the thickness of the first light shielding film 34, for example, 1.0 μm and is 0.5 μm in the example explained above. Therefore, even if undercut occurs in the second light shielding film 34 in the exposure and development steps and a sectional shape thereof changes to a so-called reverse taper shape, since an area of grounding with the second insulating film 23 as the substrate is sufficiently secured, the problem of peeling is solved.

Since the second light shielding layer 34 is formed above the metal wirings 22 above the pixel section 12 in the opening 32, the metal wirings 22 above the pixel section 12 can be shielded from light. This makes it possible to reduce flare light.

As explained above, with the first manufacturing method according to this embodiment, it is possible to solve the problem of peeling of the light shielding film 31 and reduce flare light to be equal to or smaller than a fixed amount.

Therefore, it is possible to obtain a solid-state imaging device excellent in an image quality.

A manufacturing method for the solid-state imaging device according to the second embodiment is explained with reference to sectional views of manufacturing steps in FIGS. 7A to 7D.

Figure 7A:
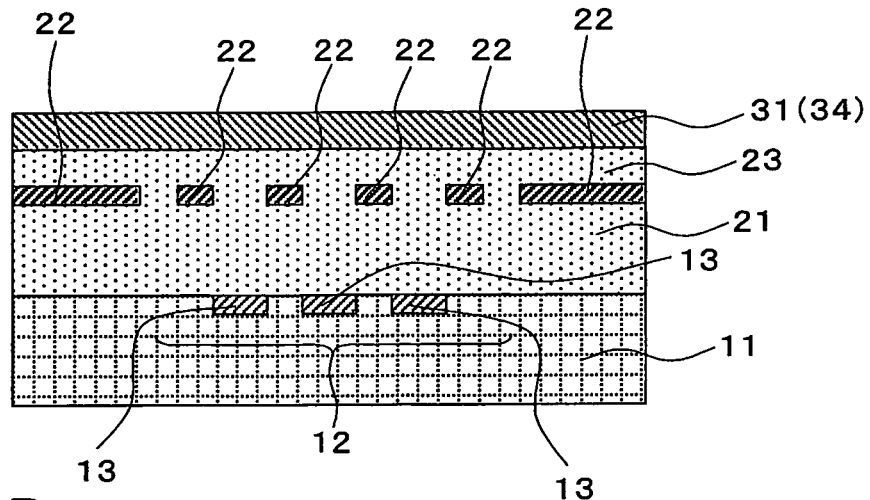
FIGS. 7A to 7D show sectional views of manufacturing steps of a manufacturing method for a solid-state imaging device according to the second embodiment.

As shown in FIG. 7A, the pixel section 12 is formed in the semiconductor substrate 11. In the pixel section 12, the plural photoelectric conversion sections 13 that photoelectrically convert incident light to generate signal charges are formed. Although not shown in the figure, in the semiconductor substrate 11, a readout section for reading out signal charges from the photoelectric conversion sections 13 and a charge transfer section for transferring the signal charges read out by the readout section are formed on one side of the photoelectric conversion sections 13. A channel stop region for pixel separation is formed on the other side of the photoelectric conversion sections 13.

The first insulating film 21 that covers a transfer electrode (not shown) formed in the charge transfer section is formed on the semiconductor substrate 11. The metal wirings 22 are formed on the first insulating film 21. The second insulating film 23 that covers the metal wirings 22 is formed on the first insulating film 21.

The second insulating film 23 is formed of a silicon nitride film, a silicon oxide nitride film, of a silicon oxide film. More preferably, the silicon nitride film is used. Moisture from the light shielding film 31 formed on the second insulating film 23 can be prevented from penetrating the photoelectric conversion sections 13 by forming the second insulating film 23 with an inorganic insulating film such as the silicon nitride film.

The light shielding film 31 is formed on the second insulating film 23. The light shielding film 31 is formed as explained below.

First, the second light shielding film 34 is formed on the second insulating film 23. The second light shielding film 34 is formed of a black photoresist in thickness smaller than that of the first light shielding film 33 to be formed later, for example, the thickness equal to or larger than 1.0 μm. In this embodiment, the second light shielding film 34 is formed in the thickness of 0.5 μm. A material of the second light shielding film 34 is explained in detail later.

Figure 7B:
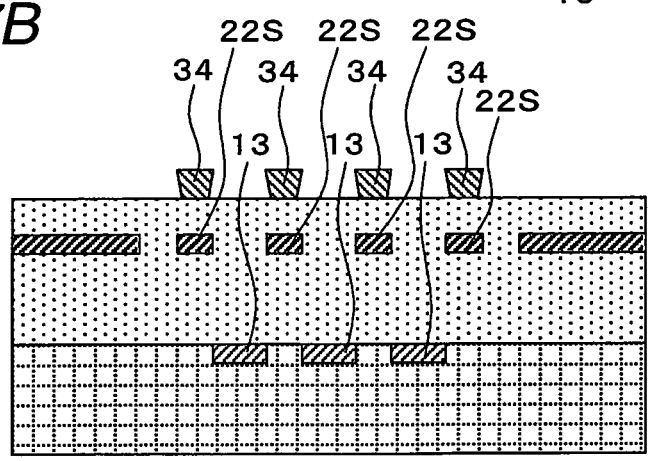

Subsequently, as shown in FIG. 7B, the second light shielding film 34 is subjected to exposure to light, development, and baking to leave the second light shielding film 34 above the metal wirings 22 (22S) above the pixel section 12 and remove the second light shielding film 34 in other regions. As a result, the second light shielding film 34 is formed above regions among the photoelectric conversion sections 13.

As an example of a lithography condition for the black color resist, a G line (436 nm) or an I line (365 nm) is used for exposure light source wavelength and exposure time is set to, for example, 1000 ms to 3000 ms. This exposure condition is only an example and appropriately changed according to a type of the black color resist.

Figure 7C:
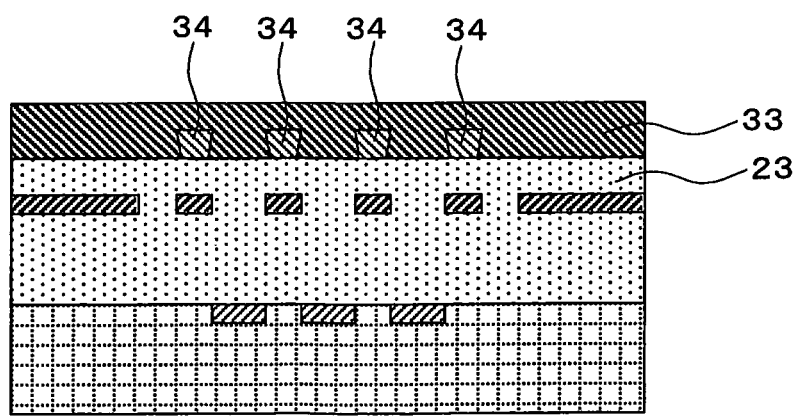

As shown in FIG. 7C, the first light shielding film 33 having thickness larger than that of the second light shielding film 34 is formed on the second insulating film 23 on which the second light shielding film 34 is formed. The first light shielding film 33 is formed of a black photoresist in, for example, the thickness equal to or larger than 1.0 µm. A material of the first light shielding film 33 is explained in detail later.

Figure 7D:
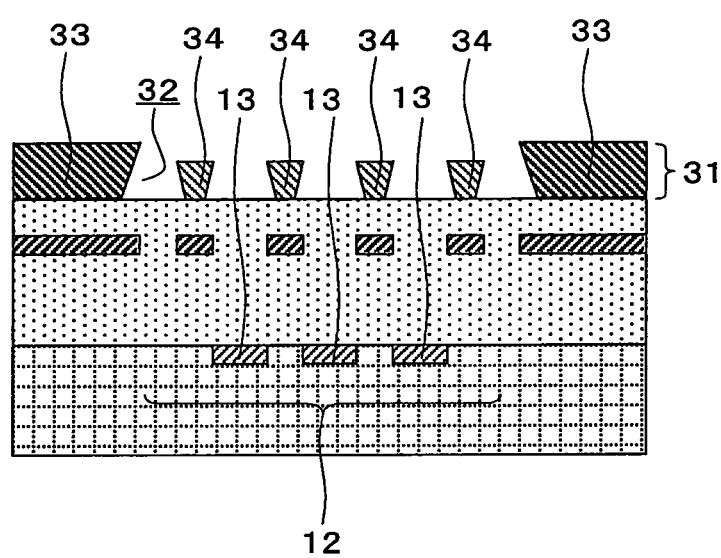

As shown in FIG. 7D, the first light shielding film 33 is subjected to exposure to light, development, and baking to form the opening 32 above the pixel section 12.

As an example of a lithography condition for the black color resist, a G line (436 nm) or an I line (365 nm) is used for exposure light source wavelength and exposure time is set to, for example, 1000 ms to 3000 ms. This exposure condition is only an example and appropriately changed according to a type of the black color resist.

When the first light shielding film 33 is patterned, since the second light shielding film 34 is cured by baking, a pattern shape is maintained even if exposure, development, and the like is applied to the first light shielding film 33.

The black color resist is a negative resist. Since exposure light attenuates in the black color resist, the black color resist has an undercut sectional shape. Therefore, for example, a pattern having, for example, pattern dimension width equal to or smaller than 1.5 µm has a reduced area of grounding with a substrate and pattern peeling occurs. Therefore, it is desirable to eliminate such a pattern from a mask.

The opening 32 means a space, a side periphery of which is surrounded by a sidewall of the first light shielding film 33 on the pixel section 12.

The first light shielding film 33 and the second light shielding film 34 are formed of insulative resin having light shielding properties. The insulative resin having light shielding properties is formed of black photosensitive insulative resin. Consequently, reflection of the light shielding films is suppressed. Moreover, it is unnecessary to form a resist mask for the patterning. In other words, there is an advantage that the patterning can be directly performed by exposure and development.

As an example of the insulative resin having light shielding properties and the black photosensitive insulative resin, there is a black color resist.

As a dye containing the black color resist as a black color, for example, there is a dye obtained by mixing plural pigments of blue and red. There is also a black pigment having low transmittance in a wide wavelength (e.g., a wavelength of visible light) band.

A dye with a mixing ratio of a resist and a pigment adjusted such that average transmittance is, for example, equal to or higher than 5% and equal to or lower than 40% with respect to, for example, light in a range of wavelength from 400 nm to 700 nm or in a wavelength band of visible light is used. If this average transmittance is lower than 5%, since photosensitivity of a photoresist is not sufficiently obtained, the patterning is difficult. If the average transmittance exceeds 40%, since light shielding properties are insufficient, a problem occurs in functions of the light shielding films. Therefore, the average transmittance is set to be equal to or higher than 5% and equal to or lower than 40%.

A negative resist is used as the resist. As an example, an acrylic negative resist or a polyimide negative resist is used.

In the second manufacturing method, the first light shielding film 33 can be formed in the thickness equal to or larger than 1 µm. Therefore, since light reflected on the large-area metal wirings 22L other than regions where the photoelectric conversion sections 13 are formed is attenuated, flare light can be suppressed.

Even if the first light shielding film 33 is formed in such thickness equal to or larger than 1 µm, the second light shielding film 34 formed above the metal wirings 22 above the pixel section 12 in the opening 32 is formed in thickness smaller than that of the first light shielding film 33, for example, the thickness of 0.5 µm. Therefore, a part of the oblique incident light about to be made incident on the photoelectric conversion sections 13, which is blocked by the light shielding film having the thickness in the past, i.e., the light shielding film having film thickness equal to the thickness of the first light shielding film 33, can be made incident on the photoelectric conversion sections 13.

Consequently, since an amount of incident light on the photoelectric conversion sections 13 increases, improvement of the sensitivity of the solid-state imaging device can be realized.

Moreover, since the second light shielding film 34 is formed above the metal wirings 22 above the pixel section 12, the second light shielding film 34 has so-called submicron line width (e.g., equal to or smaller than 1.5 µm). However, the thickness of the second light shielding film 34 is smaller than the thickness of the first light shielding film 34, for example, 1.0 µm and is 0.5 µm in the example explained above. Therefore, even if undercut occurs in the second light shielding film 34 in the exposure and development steps and a sectional shape thereof changes to a so-called reverse taper shape, since an area of grounding with the second insulating film 23 as the substrate is sufficiently secured, the problem of peeling is solved.

Since the second light shielding layer 34 is formed above the metal wirings 22 above the pixel section 12 in the opening 32, the metal wirings 22 can be shielded from light. This makes it possible to reduce flare light.

As explained above, with the second manufacturing method according to this embodiment, it is possible to solve the problem of peeling of the light shielding film 31 and reduce flare light to be equal to or smaller than a fixed amount.

Therefore, it is possible to obtain a solid-state imaging device excellent in an image quality.

A manufacturing method for the solid-state imaging device according to the third embodiment is explained with reference to sectional views of manufacturing steps in FIGS. 8A to 8D.

Figure 8A:
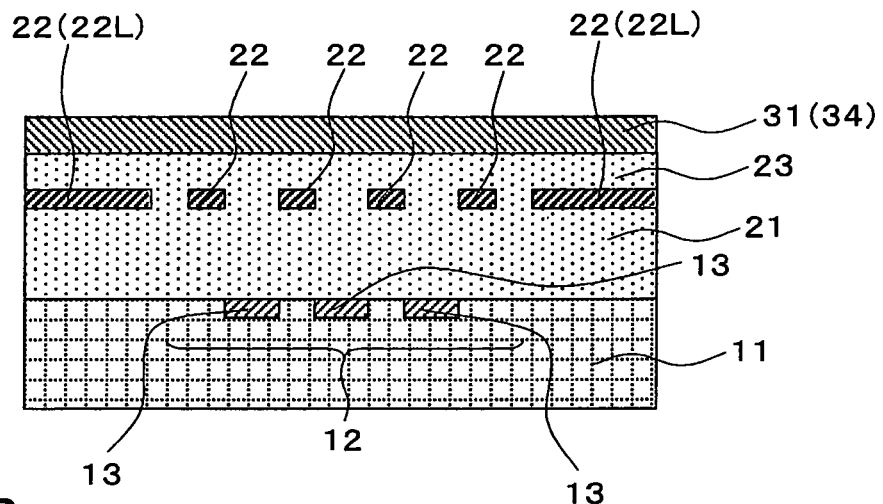
FIGS. 8A to 8D show sectional views of manufacturing steps of a manufacturing method for a solid-state imaging device according to the third embodiment.

As shown in FIG. 8A, the pixel section 12 is formed in the semiconductor substrate 11. In the pixel section 12, the plural photoelectric conversion sections 13 that photoelectrically convert incident light to generate signal charges are formed. Although not shown in the figure, in the semiconductor substrate 11, a readout section for reading out signal charges from the photoelectric conversion sections 13 and a charge transfer section for transferring the signal charges read out by the readout section are formed on one side of the photoelectric conversion sections 13. A channel stop region for pixel separation is formed on the other side of the photoelectric conversion sections 13.

The first insulating film 21 that covers a transfer electrode (not shown) formed in the charge transfer section is formed on the semiconductor substrate 11. The metal wirings 22 are formed on the first insulating film 21. The second insulating film 23 that covers the metal wirings 22 is formed on the first insulating film 21.

The second insulating film 23 is formed of a silicon nitride film, a silicon oxide nitride film, of a silicon oxide film. More preferably, the silicon nitride film is used. Moisture from the light shielding film 31 formed on the second insulating film 23 can be prevented from penetrating the photoelectric conversion sections 13 by forming the second insulating film 23 with an inorganic insulating film such as the silicon nitride film.

The light shielding film 31 is formed on the second insulating film 23. The light shielding film 31 is formed as explained below.

First, the second light shielding film 34 is formed on the second insulating film 23. The second light shielding film 34 is formed of a black photoresist in, for example, the thickness equal to or larger than 1.0 μm. In this embodiment, the second light shielding film 34 is formed in the thickness of 0.5 μm. A material of the second light shielding film 34 is explained in detail later.

Figure 8B:
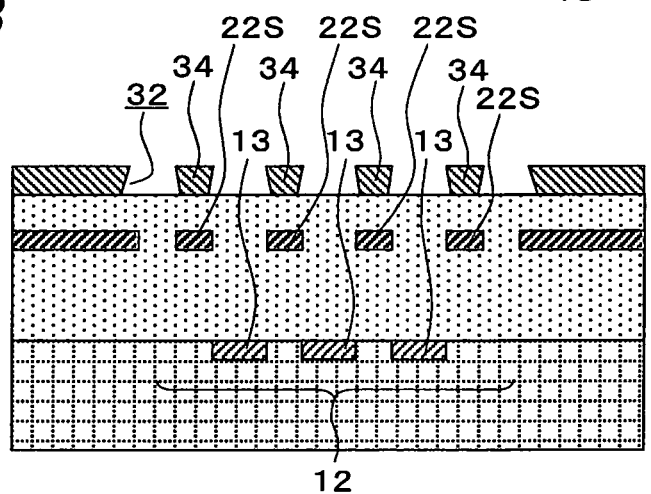

Subsequently, as shown in FIG. 8B, the second light shielding film 34 is subjected to exposure to light, development, and baking to leave the second light shielding film 34 above the metal wirings 22 above the pixel section 12 and remove the remaining second light shielding film 34 above the pixel section 12 to form the opening 32.

As an example of a lithography condition for the black color resist, a G line (436 nm) or an I line (365 nm) is used for exposure light source wavelength and exposure time is set to, for example, 1000 ms to 3000 ms. This exposure condition is only an example and appropriately changed according to a type of the black color resist.

Figure 8C:
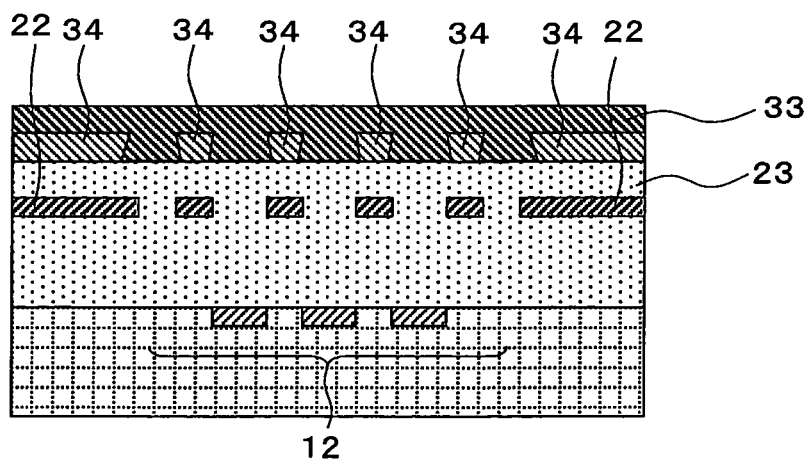

As shown in FIG. 8C, the first light shielding film 33 is formed on the second insulating film 23 on which the second light shielding film 34 is formed. The first light shielding film 33 is formed such that the thickness thereof combined with the thickness of the second light shielding film 34 prevents the occurrence of flare due to the metal wirings 22L formed around above the pixel section 12. The first light shielding film 33 is formed in, for example, the thickness equal to or larger than 1.0 μm. For example, when the second light shielding film 34 is formed in the thickness of 0.5 μm, the first light shielding film 33 can be formed in thickness equal to the thickness of the second light shielding film 34.

The first light shielding film 33 is formed of a black photoresist in, for example, the thickness equal to or larger than 1.0 μm. A material of the first light shielding film 33 is explained in detail later.

Figure 8D:
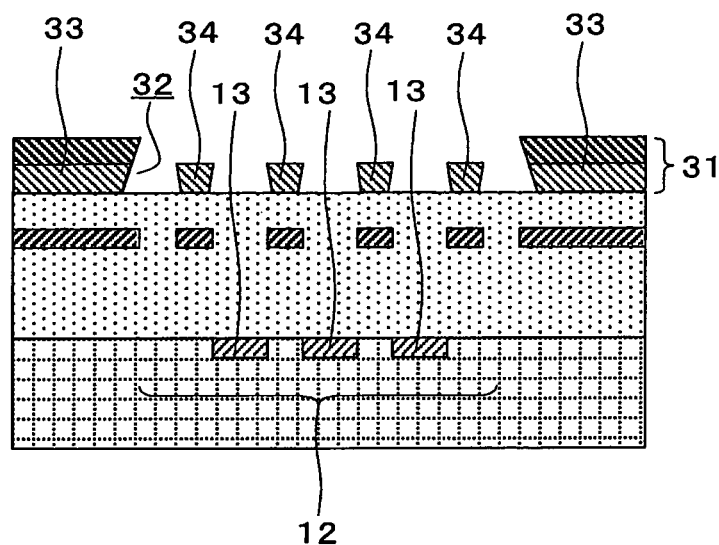

As shown in FIG. 8D, the first light shielding film 33 is subjected to exposure to light, development, and baking to form the opening 32 above the pixel section 12.

As an example of a lithography condition for the black color resist, a G line (436 nm) or an I line (365 nm) is used for exposure light source wavelength and exposure time is set to, for example, 1000 ms to 3000 ms. This exposure condition is only an example and appropriately changed according to a type of the black color resist.

When the first light shielding film 33 is patterned, since the second light shielding film 34 is cured by baking, a pattern shape is maintained even if exposure, development, and the like is applied to the first light shielding film 33.

The black color resist is a negative resist. Since exposure light attenuates in the black color resist, the black color resist has an undercut sectional shape. Therefore, for example, a pattern having, for example, pattern dimension width equal to or smaller than 1.5 μm has a reduced area of grounding with a substrate and pattern peeling occurs. Therefore, it is desirable to eliminate such a pattern from a mask.

The opening 32 means a space, a side periphery of which is surrounded by a sidewall of the light shielding film 31 formed by the first light shielding film 33 and the second light shielding film 34 on the pixel section 12.

The first light shielding film 33 and the second light shielding film 34 are formed of insulative resin having light shielding properties. The insulative resin having light shielding properties is formed of black photosensitive insulative resin. Consequently, reflection of the light shielding films is suppressed. Moreover, it is unnecessary to form a resist mask for the patterning. In other words, there is an advantage that the patterning can be directly performed by exposure and development.

As an example of the insulative resin having light shielding properties and the black photosensitive insulative resin, there is a black color resist.

As a dye containing the black color resist as a black color, for example, there is a dye obtained by mixing plural pigments of blue and red. There is also a black pigment having low transmittance in a wide wavelength (e.g., a wavelength of visible light) band.

A dye with a mixing ratio of a resist and a pigment adjusted such that average transmittance is, for example, equal to or higher than 5% and equal to or lower than 40% with respect to, for example, light in a range of wavelength from 400 nm to 700 nm or in a wavelength band of visible light is used. If this average transmittance is lower than 5%, since photosensitivity of a photoresist is not sufficiently obtained, the patterning is difficult. If the average transmittance exceeds 40%, since light shielding properties are insufficient, a problem occurs in functions of the light shielding films. Therefore, the average transmittance is set to be equal to or higher than 5% and equal to or lower than 40%.

A negative resist is used as the resist. As an example, an acrylic negative resist or a polyimide negative resist is used.

In the third manufacturing method, the light shielding film 31 obtained by combining the first light shielding film 33 and the second light shielding film 34 can be formed in the thickness equal to or larger than 1 μm. Therefore, since light reflected on the large-area metal wirings 22L other than regions where the photoelectric conversion sections 13 are formed is attenuated, flare light can be suppressed.

Even if the light shielding film 31 obtained by combining the first light shielding film 33 and the second light shielding film 34 is formed in such thickness equal to or larger than 1 μm, the second light shielding film 34 formed above the metal wirings 22 above the pixel section 12 in the opening 32 can be formed in thickness smaller than that of the light shielding film 31, for example, the thickness of 0.5 μm. Therefore, a part of the oblique incident light about to be made incident on the photoelectric conversion sections 13, which is blocked by the light shielding film having the thickness in the past, i.e., the light shielding film having film thickness equal to the thickness of the light shielding film 31, can be made incident on the photoelectric conversion sections 13.

Consequently, since an amount of incident light on the photoelectric conversion sections 13 increases, improvement of the sensitivity of the solid-state imaging device can be realized.

Moreover, since the second light shielding film 34 is formed above the metal wirings 22 above the pixel section 12, the second light shielding film 34 has so-called submicron line width (e.g., equal to or smaller than 1.5 μm). However, the thickness of the second light shielding film 34 is smaller than the thickness of the light shielding film 31, for example, 1.0 μm. Therefore, even if undercut occurs in the second light shielding film 34 in the exposure and development steps, since an area of grounding with the second insulating film 23 as the substrate is sufficiently secured, the problem of peeling is solved.

Since the second light shielding layer 34 is formed above regions among the photoelectric conversion sections 13 in the opening 32, the metal wirings 22 formed above the pixel section 11 can be shielded from light. This makes it possible to reduce flare light.

As explained above, with the third manufacturing method according to this embodiment, it is possible to solve the problem of peeling of the second light shielding film 34 and reduce flare light to be equal to or smaller than a fixed amount.

Therefore, it is possible to obtain a solid-state imaging device excellent in an image quality.

In the embodiments explained above, the thickness of the light shielding film 31 around above the pixel section 12 is set to be equal to or larger than 1.0 μm because, when light is blocked by using the black color resist, the thickness equal to or larger than 1.0 μm is necessary in order to suppress flare light due to large-area metal wirings.

When the metal wirings 22 formed above the pixel section 12 are shielded from light, it is necessary to set the line width of the light shielding films to be equal to or smaller than 1 μm in order to secure an opening area of the photoelectric conversion sections 13. Since, in general, the negative photosensitive resin is used for the black color resist, undercut occurs in a pattern sectional shape after development. In other words, the light shielding films have a reverse taper sectional shape.

Therefore, in a pattern having the line width equal to or smaller than 1 μm, since an area of grounding with the substrate is reduced, pattern peeling occurs. In order to prevent this problem, if pattern width is set to be equal to or larger 1 μm, since an opening area on the photoelectric conversion sections 13 is reduced, a part of oblique incident light is blocked and sensitivity falls.

In order to solve these problems, in the embodiments explained above, the second light shielding film 34 having the thickness smaller than that of the light shielding film 31 formed around above the pixel section 12 is formed above the metal wirings 22 above the pixel section 12. Although the second light shielding film 34 has the thickness smaller than 1.0 μm, the metal wirings 22 arranged above the regions among the photoelectric conversion sections 13 can be shielded from light far better than in a solid-state imaging device in which light shielding films are peeled and not formed at all. Therefore, a larger amount of oblique incident light made incident on the photoelectric conversion sections 13 can be taken in and occurrence of flare due to the metal wirings 22 can be reduced.

An imaging apparatus according to an embodiment of the present invention is explained with reference to a block diagram in FIG. 9. The imaging apparatus is an imaging apparatus in which the solid state imaging device according to any one of the embodiments is used.

Figure 9:
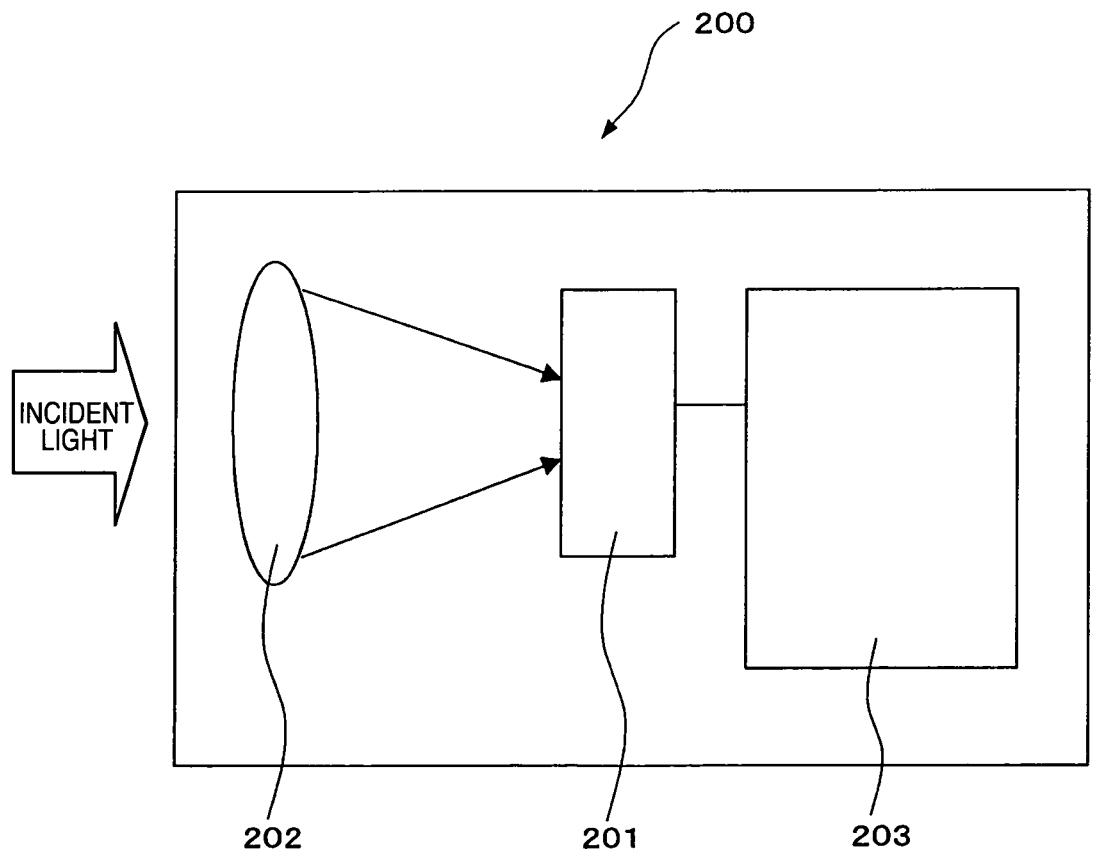
FIG. 9 is a block diagram of an imaging apparatus according to an embodiment of the present invention.

As shown in FIG. 9, an imaging apparatus 200 includes the solid-state imaging device (no shown) in an imaging unit 201. A focusing optical system 202 that focuses an image is provided on a condensing side of the imaging unit 201. A signal processing unit 203 including a driving circuit that drives the imaging unit 201 and a signal processing circuit that processes a signal, which is photoelectrically-converted by the solid-state imaging device, into an image is connected to the imaging unit 201. The image signal processed by the image signal processing unit 203 can be stored by an image storing unit (not shown). In such an imaging apparatus 200, as the solid-state imaging device, the solid-state imaging device 1, the solid-state imaging device 2, or the solid-state imaging device 3 explained in the embodiments can be used.

In the imaging apparatus 200 according to this embodiment, since the solid-state imaging device 1, 2, or 3 according to any one of the embodiments explained above is used, as explained above, the sensitivity of a light-receiving section of each of pixels is sufficiently secured. Therefore, there is an advantage that it is possible to realize pixel characteristics, for example, an increase in sensitivity. There is also an advantage that flare can be reduced.

The imaging apparatus 200 according to this embodiment is not limited to the configuration explained above. The present invention can be applied to an imaging apparatus of any configuration as long as the solid-state imaging device is used in the imaging apparatus.

The solid-state imaging device 1, 2 or 3 may be formed as one chip or may be formed as a module having an imaging function in which an imaging unit, a signal processing unit, and an optical system are collectively packaged. The present invention can be applied not only to a solid-state imaging device but also to an imaging apparatus. When the present invention is applied to the imaging apparatus, an effect of improvement of an image quality is obtained. The imaging apparatus indicates, for example, a portable apparatus having a camera and an imaging function. "Imaging" includes not only image pickup during normal camera photographing but also fingerprint detection and the like in a broad sense of the imaging.

"Black" in the present invention is ideally black that completely absorbs light. However, even if a color is not black that completely absorbs light, the color is acceptable if the color looks black or is close to black, for example, pitch-black, black, a blackish color and the like specified in color names of object colors (JIS Z 8102: 2001) of the Japan Industrial Standard (JIS). Even if a color other than black such as dark brown, dark blue, dark green, or dark blue is mixed in the color such as pitch-black, black or a blackish color, the mixed color is acceptable as long as the color as it looks is close to black.

It should be understood by those skilled in the art that various modifications, combinations, sub-combinations, and alterations may occur depending on design requirements and other factors insofar as they are within the scope of the appended claims or the equivalents thereof.

What is claimed is:

1. A manufacturing method for a solid-state imaging device comprising the steps of:
    forming, on a first insulating film that covers a pixel section having plural photoelectric conversion sections that are formed in a semiconductor substrate and photoelectrically convert incident light to generate signal charges, metal wirings above regions among the photoelectric conversion sections and above a periphery of the pixel section;
    forming a first light shielding film via a second insulating film that covers the metal wirings;
    forming an opening in the first light shielding film above the pixel section;
    forming a second light shielding film that has thickness smaller than that of the first light shielding film on the first light shielding film including the opening; and
    removing, while leaving the second light shielding film on the second insulating film above the metal wirings above the pixel section, the second light shielding film formed in other regions.

2. A manufacturing method for a solid-state imaging device according to claim 1, wherein the first light shielding film and the second light shielding film are formed of insulative resin having light shielding properties.

3. A manufacturing method for a solid-state imaging device according to claim 2, wherein the insulative resin having the light shielding properties is formed of black photosensitive insulative resin.

4. A manufacturing method for a solid-state imaging device comprising the steps of:

forming, on a first insulating film that covers a pixel section having plural photoelectric conversion sections that are formed in a semiconductor substrate and photoelectrically convert incident light to generate signal charges, metal wirings above regions among the photoelectric conversion sections and above a periphery of the pixel section;

forming a second light shielding film via a second insulating film that covers the metal wirings;

removing, while leaving the second light shielding film on the second insulating film above the metal wirings above the pixel section, the second light shielding film formed in other regions;

forming, on the second insulating film, a first light shielding film that covers the second light shielding film and has thickness larger than that of the second light shielding film; and forming an opening in the first light shielding film above the pixel section.

5. A manufacturing method for a solid-state imaging device according to claim 4, wherein the first light shielding film and the second light shielding film are formed of insulative resin having light shielding properties.

6. A manufacturing method for a solid-state imaging device according to claim 5, wherein the insulative resin having the light shielding properties is formed of black photosensitive insulative resin.

7. A manufacturing method for a solid-state imaging device comprising the steps of:

forming, on a first insulating film that covers a pixel section having plural photoelectric conversion sections that are formed in a semiconductor substrate and photoelectrically convert incident light to generate signal charges, metal wirings above regions among the photoelectric conversion sections and above a periphery of the pixel section;

forming a second light shielding film via a second insulating film that covers the metal wirings;

removing, while leaving the second light shielding film above the metal wirings above the pixel section, the remaining second light shielding film above the pixel section to form an opening;

forming, on the second insulating film, a first light shielding film that covers the second light shielding film; and forming an opening in the first light shielding film above the pixel section.

8. A manufacturing method for a solid-state imaging device according to claim 7, wherein the first light shielding film and the second light shielding film are formed of insulative resin having light shielding properties.

9. A manufacturing method for a solid-state imaging device according to claim 8, wherein the insulative resin having the light shielding properties is formed of black photosensitive insulative resin.

* * * * *